(12) United States Patent
Anderson

(10) Patent No.: US 6,937,100 B2
(45) Date of Patent: Aug. 30, 2005

(54) AMPLIFIER CIRCUIT WITH COMMON MODE FEEDBACK

(75) Inventor: Thomas R. Anderson, Tucson, AZ (US)

(73) Assignee: Standard Microsystems Corporation, Hauppauge, NY (US)

( * ) Notice: Subject to any disclaimer, the term of this patent is extended or adjusted under 35 U.S.C. 154(b) by 1 day.

(21) Appl. No.: 10/739,797

(22) Filed: Dec. 18, 2003

(65) Prior Publication Data

US 2005/0134382 A1 Jun. 23, 2005

(51) Int. Cl.[7] ............................................... H03F 3/45
(52) U.S. Cl. ..................................... 330/259; 330/258
(58) Field of Search ................................ 330/258, 259

(56) References Cited

U.S. PATENT DOCUMENTS

| | | | |
|---|---|---|---|
| 4,272,728 A * | 6/1981 | Wittlinger | 330/253 |
| 4,533,876 A | 8/1985 | Haque et al. | |
| 4,568,885 A | 2/1986 | McKenzie et al. | |
| 4,573,020 A | 2/1986 | Whatley | |
| 4,665,547 A | 5/1987 | Tuhy, Jr. | |
| 4,697,152 A | 9/1987 | Westwick | |
| 4,904,953 A | 2/1990 | McCormack | |
| 4,906,943 A | 3/1990 | Koch | |
| 5,319,316 A | 6/1994 | Fensch | |
| 5,321,370 A | 6/1994 | Yukawa | |
| 5,381,114 A | 1/1995 | Pena-Finol et al. | |
| 5,420,539 A | 5/1995 | Fensch | |
| 5,491,447 A | 2/1996 | Goetschel et al. | |
| 5,568,089 A | 10/1996 | Maru | |
| 5,729,178 A | 3/1998 | Park et al. | |
| 5,838,200 A | 11/1998 | Opris | |
| 5,847,601 A | 12/1998 | Wang | |
| 6,160,446 A | 12/2000 | Azimi et al. | |
| 6,265,941 B1 | 7/2001 | Lopata | |
| 6,380,806 B1 | 4/2002 | Ang | |
| 6,459,338 B1 | 10/2002 | Acosta et al. | |
| 6,556,081 B2 | 4/2003 | Muza | |
| 6,577,184 B2 | 6/2003 | Kwan | |
| 6,774,722 B2 * | 8/2004 | Hogervorst | 330/258 |

* cited by examiner

*Primary Examiner*—Patricia Nguyen
(74) *Attorney, Agent, or Firm*—Meyertons Hood Kivlin Kowert & Goetzel, P.C.; Jeffrey C. Hood; Erik A. Heter

(57) ABSTRACT

An amplifier circuit. In one embodiment, the amplifier circuit includes an output stage and a gain stage. The gain stage includes first and second differential output terminals that may be coupled to first and second differential input terminals of the output stage. The gain stage includes a first feedback loop and a second feedback loop. First and second half-stages within the gain stage may be coupled to provide the second feedback loop. The first half-stage may be coupled to control a first output current at the first output terminal of the gain stage, while the second-half-stage may be coupled to control a second output current at the second output terminal of the gain stage.

15 Claims, 5 Drawing Sheets

AMPLIFIER CIRCUIT WITH COMMON MODE FEEDBACK

BACKGROUND OF THE INVENTION

1. Field of the Invention

This invention relates to electronic circuits, and more particularly, to amplifier circuits.

2. Description of the Related Art

Amplifiers having common mode feedback (CMF) are used in a wide variety of operational amplifier designs. Operational amplifiers with common mode feedback typically include a differential input stage and an output stage. The input stage provides the gain for the amplifier, along with other desirable operational amplifier characteristics such as low offset voltage and high common mode rejection. The output stage provides additional power gain to drive the output signal, and also provides the function of converting the differential input signal into a single-ended output signals.

In some amplifiers the input stage converts the differential input signal to a single output connection to the input stage and CMF is not required. In other cases, such as very wide input common mode range, the output is differential, and CMF is used to control the DC bias voltage of the high impedance node where the input stage and output stage are connected together. Controlling the DC bias voltage controlled by the CMF is important for maintaining all of the active devices in the proper operating range, and also determines the idling current (sometimes called quiescent current) in the output stage.

FIG. 1 is a schematic diagram of one embodiment of an operational amplifier output having differential inputs and a single-ended output. Output stage 10 includes two terminals, In+ and In−, that may be coupled to differential output terminals of a gain stage. A single-ended output (Out) is provided in order to couple the amplifier circuit to a load circuit. Although the embodiment here utilizes complementary metal oxide semiconductor (CMOS) transistors, embodiments utilizing bi-polar transistors are also possible.

FIG. 2 is a schematic diagram of one embodiment of a gain stage for an amplifier circuit having differential inputs. Gain stage 15 includes a pair of output terminals (Out+ and Out−) that may be coupled to the input terminals of an output stage such as the one illustrated in FIG. 1. In order to control the voltage at the output terminals, common mode feedback is employed. This also determines the current through transistors M5 and M6. The common mode feedback loop includes the junction of R1, R2, and the gate terminal of M3. Using the common mode feedback loop forces the output currents from M5 and M6 to be equal to the output current of M1 and M2, respectively. The CMF also forces the DC voltage at Out+ and Out− to be equal to the Vgs of M9. It should be noted that the gate terminals of M1 and M2 serve as differential signal inputs for the gain stage of circuit illustrated in FIG. 2.

During the operation of an amplifier such as one combining the circuits of FIG. 1 and FIG. 2, it is important to carefully control the bias currents and voltages in the amplifier stages. An operational amplifier often times need to have a voltage swing that is very close to the positive power supply and the circuit ground. This may necessitate an additional requirement of controlling the bias current in the output stage when the input signal is zero or near zero while coupling the driving signal to the to the output. If the bias control is not properly designed, the transistors can enter the linear region (for a CMOS implementation) of operation, and thus the amplifier circuit may no longer provide the desired gain to the signal. Because the DC voltage at nodes Out+ and Out− of FIG. 2 are equal to the gate to source voltage of M9, the gate to source voltage of transistors M1 and M4 of FIG. 1 also have the same gate to source voltage as M9. This allows control of the bias current in M1 and M4 of FIG. 2 by designing them to be scaled replicas of M9.

SUMMARY OF THE INVENTION

An amplifier circuit is disclosed. In one embodiment, the amplifier circuit includes an output stage and a gain stage. The gain stage includes first and second differential output terminals that may be coupled to first and second differential input terminals of the output stage. The gain stage includes a first feedback loop and a second feedback loop. First and second half-stages within the gain stage may be coupled to provide the second feedback loop. The first half-stage may be coupled to control a first output current at the first output terminal of the gain stage, while the second-half-stage may be coupled to control a second output current at the second output terminal of the gain stage.

In one embodiment, the amplifier circuit may be implemented using CMOS devices. Other embodiments are possible and contemplated wherein bi-polar devices are used to implement the amplifier circuit.

BRIEF DESCRIPTION OF THE DRAWINGS

Other aspects of the invention will become apparent upon reading the following detailed description and upon reference to the accompanying drawings in which.

Figure 1:
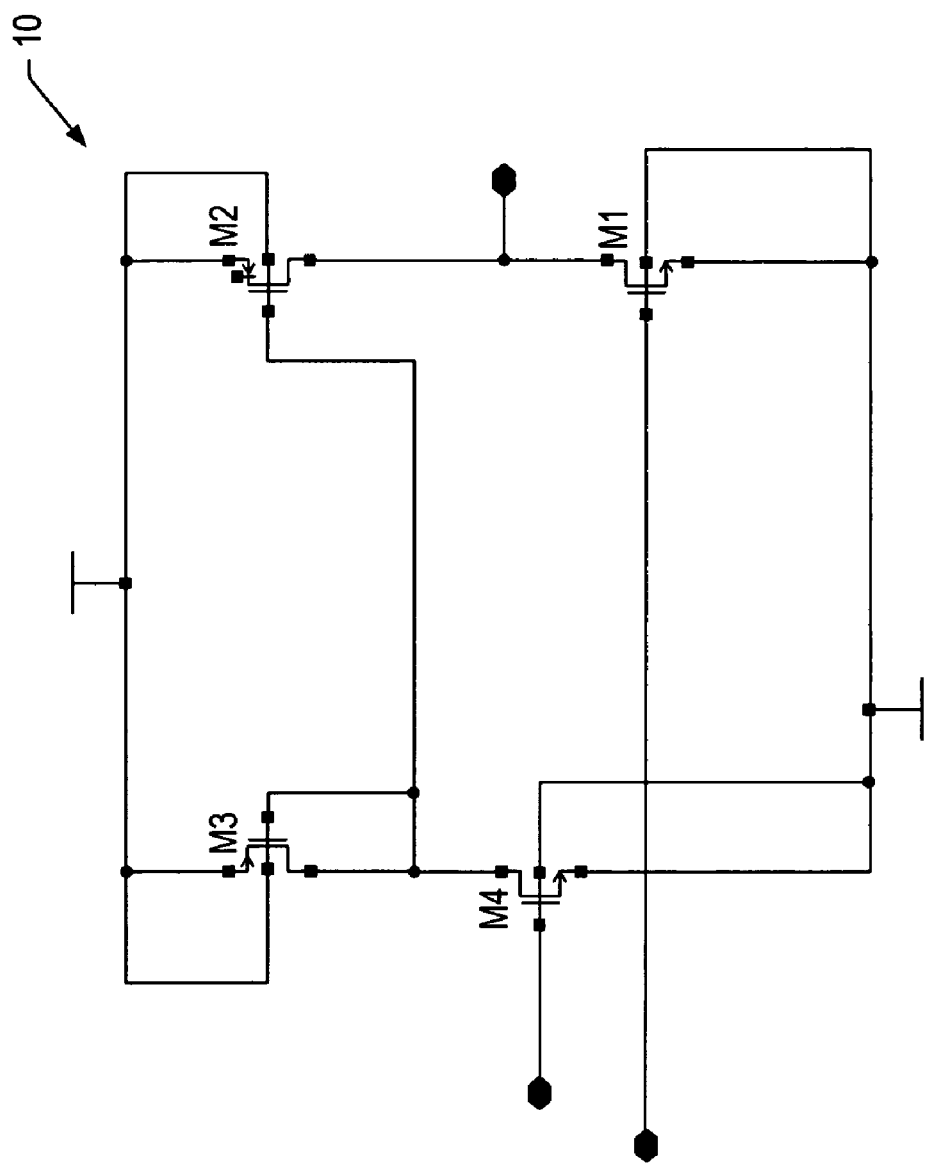
FIG. 1 (prior art) is a schematic diagram of one embodiment of an output stage for an amplifier circuit having differential inputs and a single-ended output.
Figure 2:
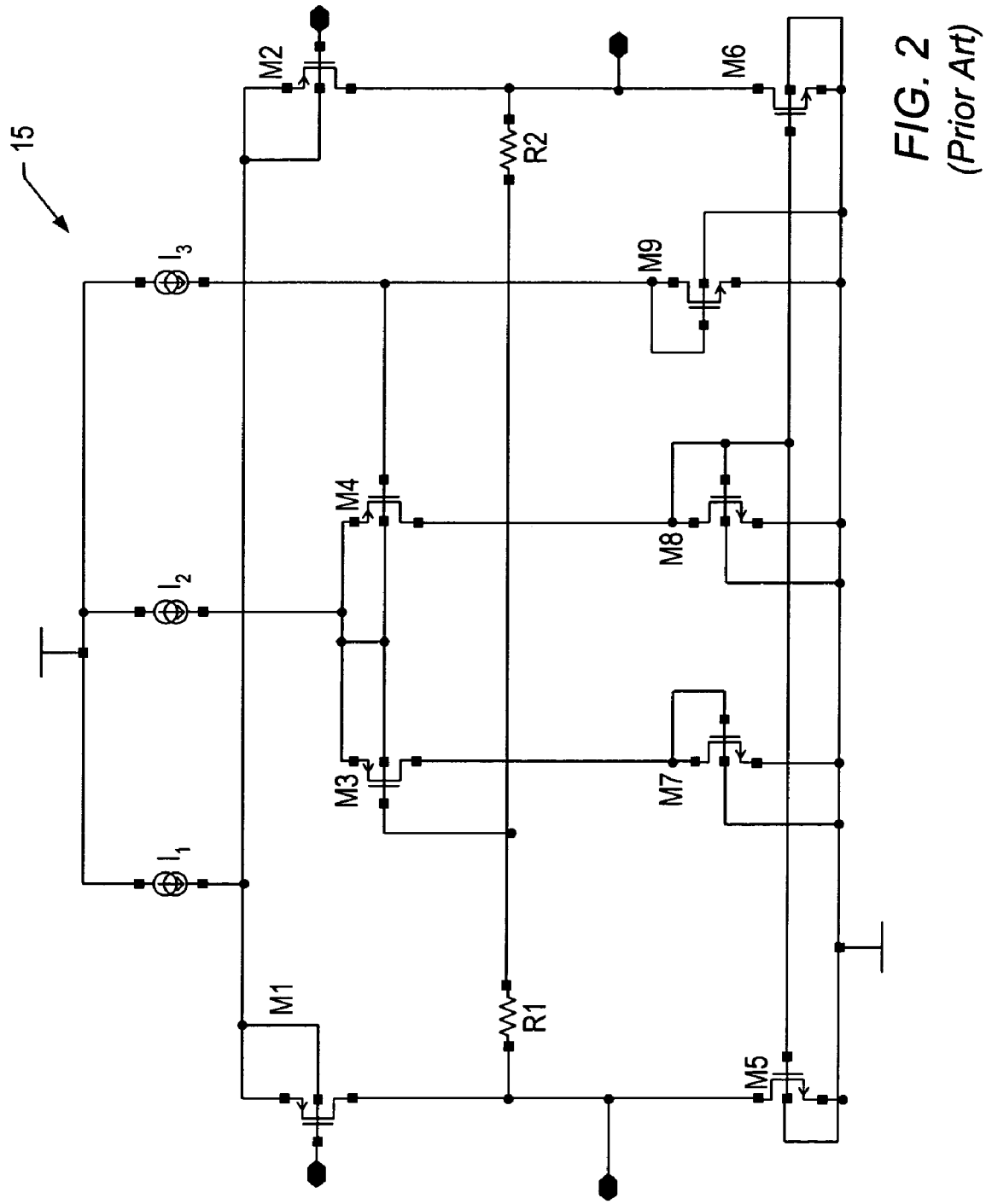
FIG. 2 (prior art) is a schematic diagram of one embodiment of a gain stage for an amplifier circuit having differential inputs.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

Figure 3:
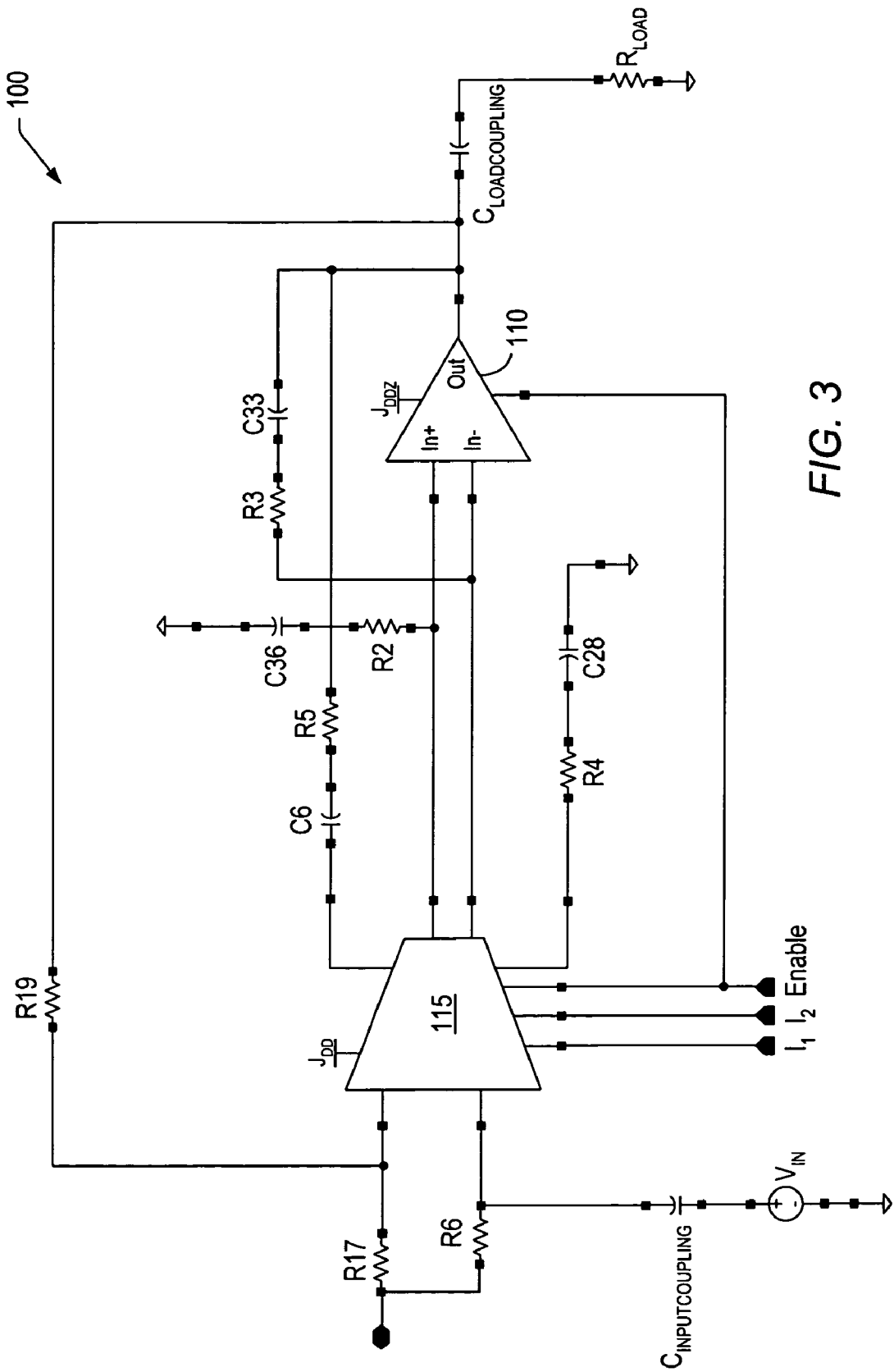
FIG. 3 is a block diagram of one embodiment of an amplifier circuit having a gain stage and an output stage.

Turning now to FIG. 3, a block diagram of one embodiment of an amplifier circuit having a gain stage and an output stage is shown. In the embodiment shown, amplifier circuit 100 includes output stage 110, which is coupled to gain stage 115.

In the embodiment shown, gain stage 115 includes a pair of differential inputs, Pin and Min, which are non-inverting and inverting inputs, respectively. In this particular example, each of the inputs is coupled to a reference voltage (through resistors as shown), although other circuit configurations are possible and contemplated. In addition, the inverting input is coupled to receive an input signal Vin via the input coupling capacitor shown. In general, gain stage is configured to receive and amplify a differential signal. Gain stage 115 also includes a pair of differential outputs (Out+ and Out−) from which the amplified differential signal may be driven.

Output stage 110 is coupled to receive the amplified differential signal driven from gain stage 115 through inputs In + and In−, which are also non-inverting and inverting inputs (respectively). In this particular embodiment, output stage 110 is configured to provide a single-ended output signal through its output (Out), although embodiments are possible and contemplated wherein output stage 110 may provide a differential output.

The example circuit shown in FIG. 3 also includes a feedback loop through R19, which sets a closed loop gain for the amplifier. In addition, the circuit configuration shown here also includes phase compensation component C6, R5, C28, R4, C36, and R2. C6 and R4 are coupled to compensation inputs (comp+ and comp−) of the gain stage. As previously noted, this is just one of many possible circuit configurations for an amplifier circuit employing output stage 110 and gain stage 115. It is also noted that in this configuration that output stage 110 is powered separately from gain stage 115.

Figure 4:
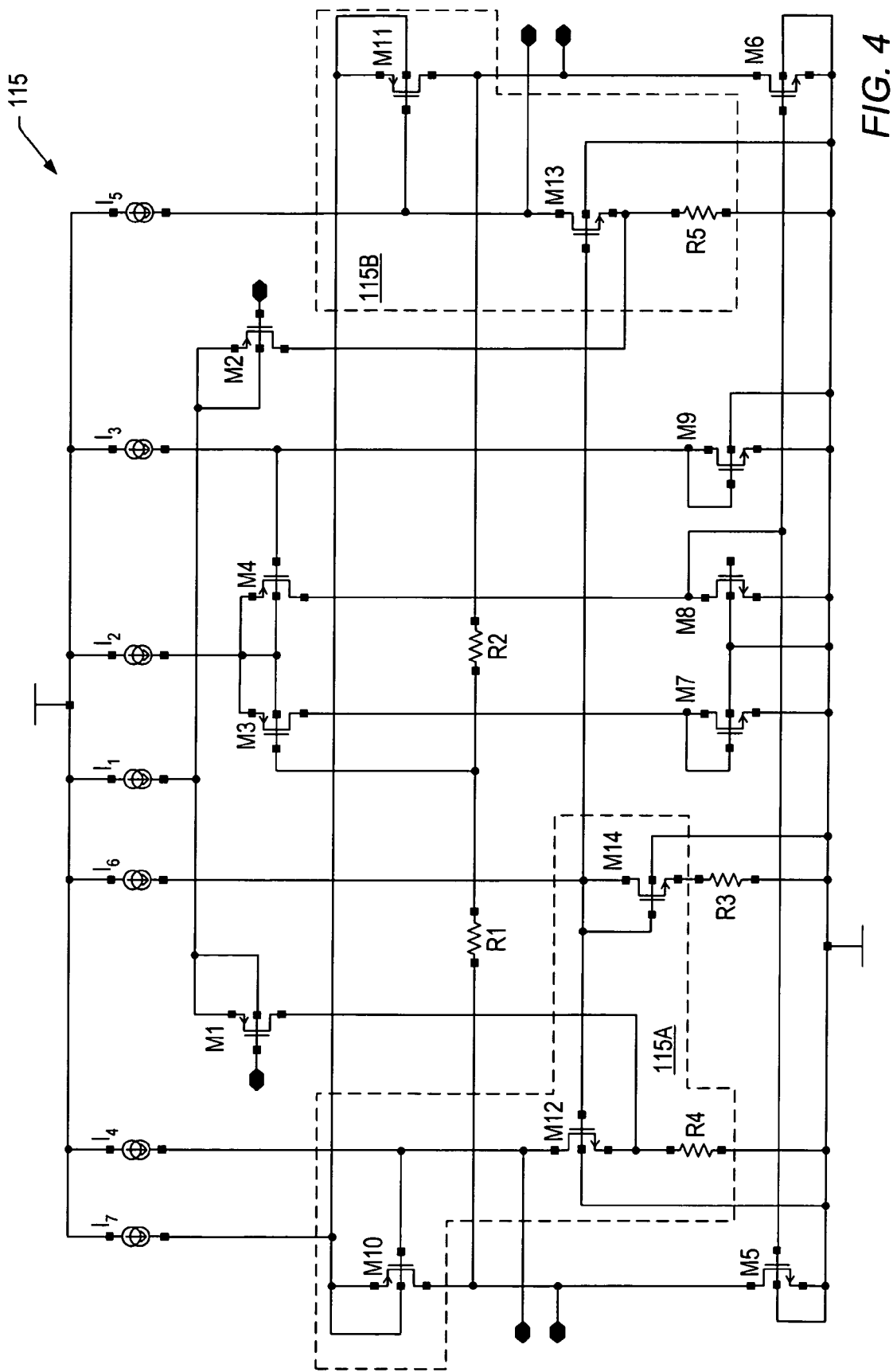
FIG. 4 is a schematic diagram of one embodiment of a gain stage of an amplifier circuit, the gain stage including multiple common-mode feedback loops.

FIG. 4 is a schematic diagram of one embodiment of a gain stage of an amplifier circuit, the gain stage including multiple common-mode feedback loops. In the embodiment shown, gain stage 115 may be considered to be two half-stages (115A and 115B), which are denoted by the dashed lines. These half-stages include a common-mode feedback loop (with half the loop present in each stage), which may allow for greater control of the bias currents at the output nodes of gain stage 115.

Gain stage 115 also includes a plurality of current sources I1 through I7, each of which may comprise one or more transistors. These current sources provide current that may be necessary to perform proper biasing of the output currents.

The first half-stage 115A is coupled to both the source terminal (via R4) and drain terminal (via M10) of transistor M5 (between the first differential input terminal and the gain stage). As such, first half-stage 115A may control the output current of M5. Similarly, the second half-stage is arranged between the second differential input and the gains stage and thus may control the output current of M6, which is coupled to R5 through its source terminal and M1 through its drain terminal. Each half-stage includes a load circuit for the input transistors M1 and M2, as well as providing an additional differential pair (M10 and M11) for driving the load circuits (M5 and M6) of the output terminals. Both first half-stage 115A and second half-stage 115B are coupled to receive D.C. voltages at the comp− and comp+inputs, respectively.

A common mode feedback loop is provided in the circuit of FIG. 4 through resistor R2 (from Out+), resistor R1 (from Out−) and through transistor M3. Resistors R1 and R2 subtract the voltages at Out− and Out+, respectively, and connect this difference voltage to the gate of M3. Transistor M3 is part of a current mirror that may work in conjunction with half-stages 115A and 115B to control the current through output transistors M5 and M6. The current mirror includes transistors M3, M4, M7 and M8, and receives current from current source I2. Current source I3 and transistor M9 are coupled to the gate terminal of M4 and may thus provide it a bias current.

The common mode function is provided due to the fact that when two high impedance current sources are coupled together (e.g., an output transistor of the gain stage and an input transistor of the output stage), the circuit may have very high gain at the connected nodes. A current imbalance at that node can cause the voltage to increase or decrease until power supply limits are reached.

Figure 5:
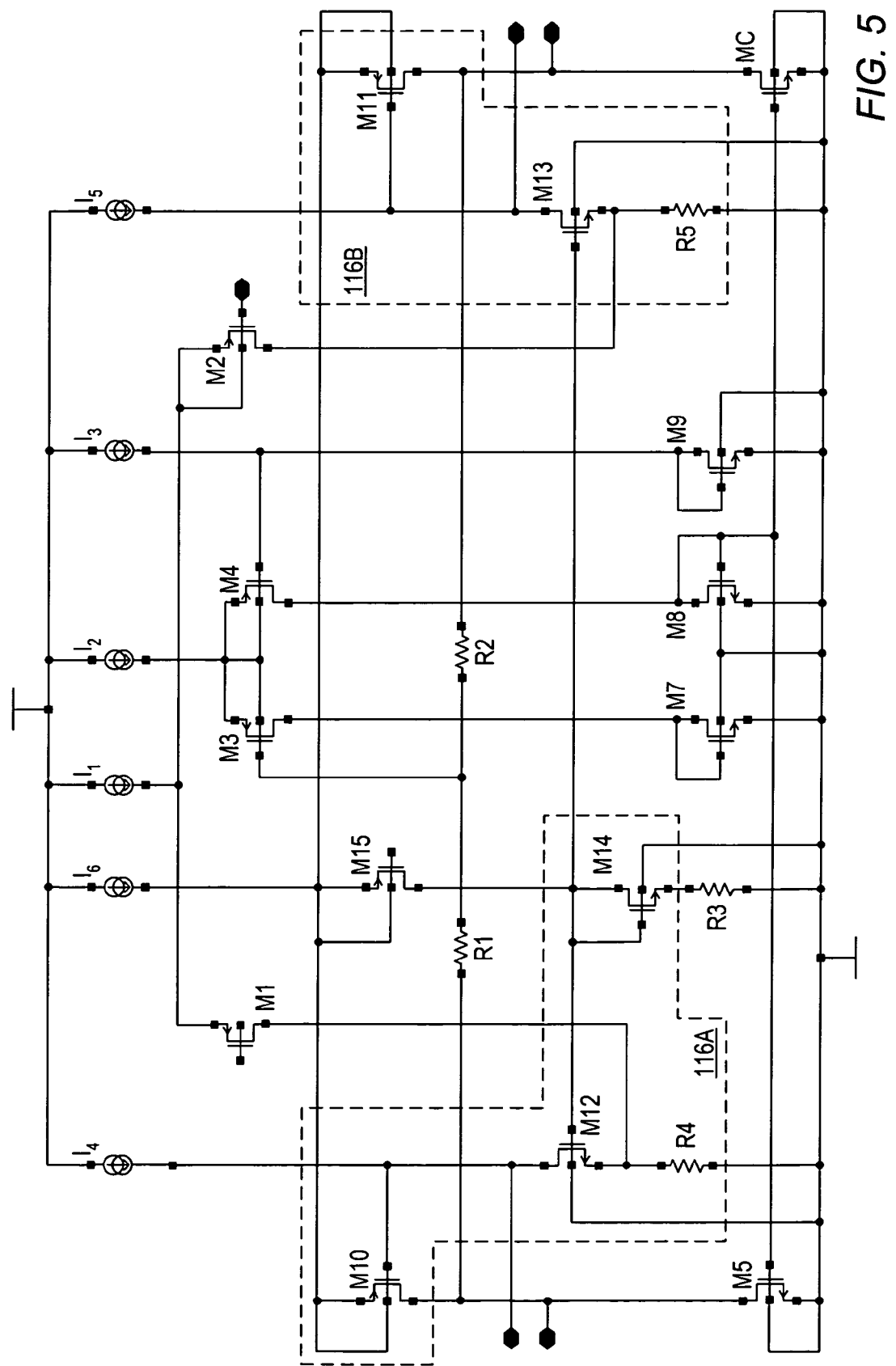
FIG. 5 is a schematic diagram of another embodiment of a gain stage of an amplifier circuit, the gain stage including multiple common-mode feedback loops.

Turning now to FIG. 5, a schematic diagram of another embodiment of a gain stage of an amplifier circuit, the gain stage including multiple common-mode feedback loops is shown. Gain stage 116 shown in FIG. 5 is similar to gain stage 115, and includes half-stages 116A and 116B. In addition to the half-stages, this embodiment of gain stage 116 includes an extra transistor M15. The combination of transistors M14 and M15 provide a common-mode feedback function that may allow for more precise control of the currents through output transistors M5 and M6.

Gain stage 116 includes two common mode feedback paths. The first common mode feedback path includes resistors R1, R2, and transistor M3, similar to the feedback loop for the embodiment discussed in reference to FIG. 4. Resistors R1 and R2 in this feedback loop perform the same function of subtracting the voltages of Out− and Out+, respectively, and connecting this difference to the gate terminal of M3. Transistors M3 and M4 form a differential pair that compares the difference voltage to a reference voltage present on the gate terminal of M4. The reference voltage at the gate terminal of M4 is set by transistor M9, which operates in conjunction with current source I3. M8 serves as an input device to the current mirror, where the outputs of the current mirror are M5 and M6. Transistor M7 is used to set the drain voltage of M3 equal to the drain voltage of M4. Thus, the outputs of transistors M7 and M8 provide a degree of control to the current through transistors M5 and M6. More particularly, the first feedback loop may aid in forcing the output current of M5 and M6 to be equal to the output currents of M1 and M2, respectively. This control is based upon the common mode feedback conveyed through M3 and M7 to the drain terminal of M5.

The second common mode feedback path includes the path through the transistors M15 and M14. Transistor M15 is coupled to both transistors M10 and M11, each of which is connected to an output node and is part of one of the amplifier half-stages. Transistors M14 and M15 operating in conjunction control the currents through transistors M12 and M13. In particular, transistors M14 and M15 may cause the currents through M12 and M13 to be substantially equal to that provided by current sources I4 and I5, respectively. This may force the DC voltage at the high impedance nodes comp+ and comp− to be equal to the input voltage Vcm1 on the gate terminal of M15. Thus, when the circuit is balanced, currents may split between transistors M10, M11, and M15 according to the size of their respective area ratios. Furthermore, the current through transistor M14 and resistor R2 sets the gate voltages for transistors M12 and M13. Currents from input transistors M1 and M2 are coupled to resistors R4 and R5, respectively, which are respectively coupled to the source terminals of M12 and M13.

With the addition of the extra common mode feedback loop, the voltages at the comp− and comp+terminals may be set to a value that is appropriate for the particular application and particular implementation of the current sources I1 through I6. In various embodiments, the current sources may comprise a transistor and a resistor (e.g., such as a resistor coupled to the source terminal of a MOS transistor). The extra common mode feedback loop may provide more precise control of the currents through output transistors M5 and M6, which may in turn prevent the transistors from entering the saturation region (for MOS embodiments) which may result in the gain stage actually attenuating the signal. Embodiments implemented using bipolar transistors may function in a similar manner.

The feedback loop in FIGS. 3 and 4 takes care of controlling the current balance at nodes Out+ and Out–. With the addition of the extra half stage for additional gain, another pair of high impedance nodes is created at nodes comp+ and comp–. These nodes require and additional CMF circuit to balance the currents.

In one particular embodiment, if the current sources I1 through I5 comprise a MOS transistor and a source resistor, current source I6 may simply be a resistor coupled to a voltage potential VG, which may be the same voltage potential coupled to the gate of transistor M15. In such an embodiment, the voltage across the resistor used to implement current source I6 at the same voltage used for the other current source resistors and may provide greater accuracy for the amplified signal as well as more efficient rejection of power supply noise. In another embodiment, if the current source I1–I5 are cascode PMOS current sources with cascode devices connected to a cascode bias voltage VC, current source I6 may be implemented as a PMOS current source with no cascode device, with the gate terminal of M15 coupled to the same cascode bias voltage VC.

Thus, gain stage 116 may provide a circuit for biasing the output common mode voltage of a differential input, differential output transconductor such that the output voltage can be directly coupled to an output stage. This allows both the coupling of the signal to the output stage and control of the quiescent current in the output stage. Gain stage 116 may also provide proper bias voltages for an output stage.

While each of the embodiments discussed above were implemented using MOSFET transistors, other embodiments implemented using JFETs or bipolar transistors are also possible and contemplated. Furthermore, while the transistors in the embodiments shown have a specific polarity, embodiments implemented using the opposite polarity are also possible and contemplated.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. An amplifier circuit comprising:
    an output stage having an output terminal and first and second differential input terminals;
    a gain stage, the gain stage having a first output terminal and a second output terminal, wherein the first output and the second output are each coupled to a first feedback loop, wherein the first output terminal is coupled to the first differential input terminal of the output stage and the second output terminal is coupled to the second differential input terminal of the output stage;
    a first half-stage and a second half-stage, wherein both the first half-stage and the second half-stage are each coupled to provide a second feedback loop, wherein the first half-stage is coupled to control an output current of the first output and wherein the second half-stage is coupled to control an output current of the second output.

2. The amplifier circuit as recited in claim 1, wherein the first half-stage includes a first transistor having a terminal coupled to the first output terminal and a second transistor having a terminal coupled to a terminal of an output transistor of the gain stage, wherein the second feedback loop includes the first transistor and the second transistor.

3. The amplifier circuit as recited in claim 2, wherein the first half-stage includes a third transistor, wherein the third transistor is arranged in the second feedback loop between the first transistor and the second transistor.

4. The amplifier circuit as recited in claim 1, wherein the first half-stage is arranged between the first differential input terminal and the gain stage and wherein the second-half stage is arranged between the second differential input and the gain stage.

5. The amplifier circuit as recited in claim 1, wherein the gain stage includes a current mirror.

6. The amplifier circuit as recited in claim 5, wherein a path of the first feedback loop includes the current mirror.

7. The amplifier circuit as recited in claim 1, wherein the output stage has a single-ended output.

8. The amplifier circuit as recited in claim 1, wherein the gain stage includes a pair of differential signal inputs.

9. The amplifier circuit as recited in claim 1, wherein the gain stage includes a pair of D.C. voltage inputs.

10. The amplifier circuit as recited in claim 1, wherein the output stage is powered separately from the gain stage.

11. A method for operating an amplifier circuit, the method comprising:
    controlling an output current of a first differential output of a gain stage using a first half-stage within the gain stage; and
    controlling an output current of a second differential output of the gain stage using a second half-stage within the gain stage.

12. The method as recited in claim 11 further comprising a DC bias voltage to an output stage, wherein the output stage includes a first differential input coupled to the first differential output of the gain stage and a second differential input coupled to the second differential output of the gain stage.

13. The method as recited in claim 11, wherein common mode feedback is provided through a first feedback loop in the gain stage and a second feedback loop through the first and second half-stages.

14. The method as recited in claim 11 further comprising driving an first differential output signal from the first differential output of the gain stage to a first differential input of an output stage and driving a second differential output signal from the second differential output to a second differential input of the output stage.

15. The method as recited in claim 14 further comprising powering the gain stage separately from the output stage.

* * * * *